(12) United States Patent
Shi et al.

(10) Patent No.: US 7,761,838 B2
(45) Date of Patent: Jul. 20, 2010

(54) METHOD FOR FABRICATING A SEMICONDUCTOR DEVICE HAVING AN EXTENDED STRESS LINER

(75) Inventors: Zhonghai Shi, Austin, TX (US); Mark Michael, Cedar Park, TX (US); Donna Michael, legal representative, Cedar Park, TX (US); David Wu, Austin, TX (US); James F. Buller, Austin, TX (US); Jingrong Zhou, Austin, TX (US); Akif Sultan, Austin, TX (US)

(73) Assignee: Globalfoundries Inc., Grand Cayman (KY)

( * ) Notice: Subject to any disclaimer, the term of this patent is extended or adjusted under 35 U.S.C. 154(b) by 435 days.

(21) Appl. No.: 11/861,492

(22) Filed: Sep. 26, 2007

(65) Prior Publication Data

US 2009/0081837 A1 Mar. 26, 2009

(51) Int. Cl.
*G06F 17/50* (2006.01)
*H01L 21/8238* (2006.01)
(52) U.S. Cl. ............................ 716/19; 716/21; 438/199
(58) Field of Classification Search ................... None
See application file for complete search history.

(56) References Cited

U.S. PATENT DOCUMENTS

| | | | |
|---|---|---|---|
| 7,002,209 B2 | 2/2006 | Chen et al. | |
| 7,297,584 B2 * | 11/2007 | Park et al. | 438/199 |
| 7,329,571 B2 * | 2/2008 | Hoentschel et al. | 438/199 |
| 7,442,597 B2 * | 10/2008 | Tsui et al. | 438/199 |
| 7,482,215 B2 * | 1/2009 | Dyer et al. | 438/199 |
| 7,538,339 B2 * | 5/2009 | Greene et al. | 257/18 |
| 2007/0082439 A1 | 4/2007 | Park et al. | |
| 2007/0108526 A1 * | 5/2007 | Kohyama | 257/351 |
| 2009/0079011 A1 * | 3/2009 | Chidambarrao et al. | 257/390 |

OTHER PUBLICATIONS

Grudowski et al., "1D and 2D Geometry Effects in Uniaxially-Strained Dual Etch Stop Layer Stressor Integrations," 2006 Symposium on VLSI Technology Digest of Technical Papers, 2 pages.*
Moroz et al., "Stress-Aware Design Methodology," Proceedings of the 7th Int'l Symposium on Quality Electronic Design (ISQED'06), 6 pages.*
Yang et al., "Dual Stress Liner for High Performance sub-45nm Gate Length SOI CMOS Manufacturing," 2004 IEEE, 3 pages.*

* cited by examiner

*Primary Examiner*—Leigh Marie Garbowski
(74) *Attorney, Agent, or Firm*—Ingrassia Fisher & Lorenz, P.C.

(57) ABSTRACT

The techniques and technologies described herein relate to the automatic creation of photoresist masks for stress liners used with semiconductor based transistor devices. The stress liner masks are generated with automated design tools that leverage layout data corresponding to features, devices, and structures on the wafer. A resulting stress liner mask (and wafers fabricated using the stress liner mask) defines a stress liner coverage area that extends beyond the boundary of the transistor area and into a stress insensitive area of the wafer. The extended stress liner further enhances performance of the respective transistor by providing additional compressive/tensile stress.

24 Claims, 4 Drawing Sheets

METHOD FOR FABRICATING A SEMICONDUCTOR DEVICE HAVING AN EXTENDED STRESS LINER

TECHNICAL FIELD

Embodiments of the subject matter described herein relate generally manufacturing processes for semiconductor devices. More particularly, embodiments of the subject matter relate to a manufacturing process for a semiconductor device having a stress liner.

BACKGROUND

A complementary metal oxide semiconductor (CMOS) transistor device is a device having both p-channel MOS (PMOS) and n-channel MOS (NMOS) transistors formed on a common semiconductor substrate. A stress liner formed from a material having compressive characteristics can be applied over PMOS devices to improve the mobility of holes in the p-channels. Conversely, a stress liner formed from a material having tensile characteristics can be applied over NMOS devices to improve the mobility of electrons in the n-channels. Some CMOS devices utilize a dual stress liner approach where compressive/tensile stress liners are formed over the PMOS/NMOS devices on the same wafer.

Stress inducing nitride, such as plasma enhanced nitride (PEN) is commonly used to form stress liners, where compressive nitride is applied to PMOS devices and tensile nitride is applied to NMOS devices. Conventional fabrication techniques result in full device coverage of compressive or tensile nitride, and some areas of the wafer may have both in an overlapping arrangement. The different stress liner areas are typically formed using two photolithography-based procedures; one for the tensile nitride areas, and one for the compressive nitride areas. The tensile nitride liner is created by: forming a layer of tensile nitride over the PMOS devices, the NMOS devices, and other devices or elements; forming, exposing, and developing a photoresist mask for the tensile nitride layer (i.e., the tensile nitride mask); and etching away the tensile nitride that remains unprotected by the tensile nitride mask. This results in a tensile liner that covers at least the NMOS devices. After removal of the tensile nitride mask, the compressive liner is created by: forming a layer of compressive nitride over the PMOS and NMOS devices (and over the existing tensile liner); forming, exposing, and developing a photoresist mask for the compressive nitride layer (i.e., the compressive nitride mask); and etching away the compressive nitride that remains unprotected by the compressive nitride mask. This results in a compressive liner that covers the PMOS devices.

For the process described above, the compressive nitride and tensile nitride masks can be automatically generated using suitable design automation tools. Conventional processes (for devices formed on a p-type semiconductor substrate) automatically generate the compressive nitride mask based upon the location of the n-wells of the PMOS devices. In other words, the compressive nitride mask will be automatically designed such that it covers an area that corresponds to the n-wells of the PMOS devices. These conventional processes also automatically generate the tensile nitride mask based upon the location of the n-wells of the PMOS devices—the tensile nitride mask will be automatically designed such that it covers the areas that do not correspond to the n-wells of the PMOS devices. Thus, the areas covered by the tensile nitride mask will include the NMOS devices and all other structures, such as non-transistor structures.

While such automatically generated stress liner masks are easy to define (because they leverage the known dimensions corresponding to the n-wells), they are inherently linked to the layout of the n-wells and, therefore, may not produce stress liner layouts that take full advantage of their compressive/tensile characteristics. For example, in certain situations it might be desirable to fabricate a compressive liner that extends well beyond the boundary of an n-well to enhance the compressive stress imparted by the compressive material. A "customized" compressive nitride mask such as this can be manually designed (drawn), however, such manual design is time consuming and inefficient.

BRIEF SUMMARY

An embodiment of a fabrication method for semiconductor devices utilizes a stress inducing liner to enhance the performance of transistor devices formed on the wafer. The layout of the photoresist mask that defines the boundary of the stress inducing liner is generated by an automated design tool. The layout of this photoresist mask is automatically generated such that the resulting stress inducing liner covers the intended transistor devices and extends beyond the transistor device area into a stress insensitive area.

An embodiment of a fabrication method for semiconductor devices accesses a feature database for a semiconductor wafer, where the feature database contains layout data corresponding to features for the semiconductor wafer, and where the layout data indicates p-type metal oxide semiconductor (PMOS) transistor areas for the semiconductor wafer. The method also involves determining, from the layout data, stress insensitive areas for the semiconductor wafer, and generating a compressive liner mask for the semiconductor wafer. The compressive liner mask has a compressive liner layout that defines coverage for at least the PMOS transistor areas and coverage that extends into the stress insensitive areas.

Another embodiment of a fabrication method for semiconductor devices accesses a feature database for a semiconductor wafer, where the feature database contains layout data corresponding to features for the semiconductor wafer, and where the layout data indicates n-type metal oxide semiconductor (NMOS) transistor areas for the semiconductor wafer. The method also involves determining, from the layout data, stress insensitive areas for the semiconductor wafer, and generating a tensile liner mask for the semiconductor wafer. The tensile liner mask has a tensile liner layout that defines coverage for at least the NMOS transistor areas and coverage that extends into the stress insensitive areas.

Another embodiment of a fabrication method for semiconductor devices involves: forming a PMOS transistor structure on a semiconductor substrate; forming stress insensitive features on the semiconductor substrate, the stress insensitive features being located adjacent to the PMOS transistor structure; and forming a compressive stress liner over the PMOS transistor structure and over at least some of the stress insensitive features, the compressive stress liner being patterned with a compressive liner mask that is automatically generated based upon layout locations of the PMOS transistor structure and the stress insensitive features.

Another embodiment of a fabrication method for semiconductor devices involves: forming an NMOS transistor structure on the semiconductor substrate; forming stress insensitive features on the semiconductor substrate, the stress insensitive features being located adjacent to the NMOS transistor structure; and forming a tensile stress liner over the NMOS transistor structure and over at least some of the stress insensitive features, the tensile stress liner being patterned with a tensile liner mask that is automatically generated based upon layout locations of the NMOS transistor structure and the stress insensitive features.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate metal oxide semiconductor (MOS) transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
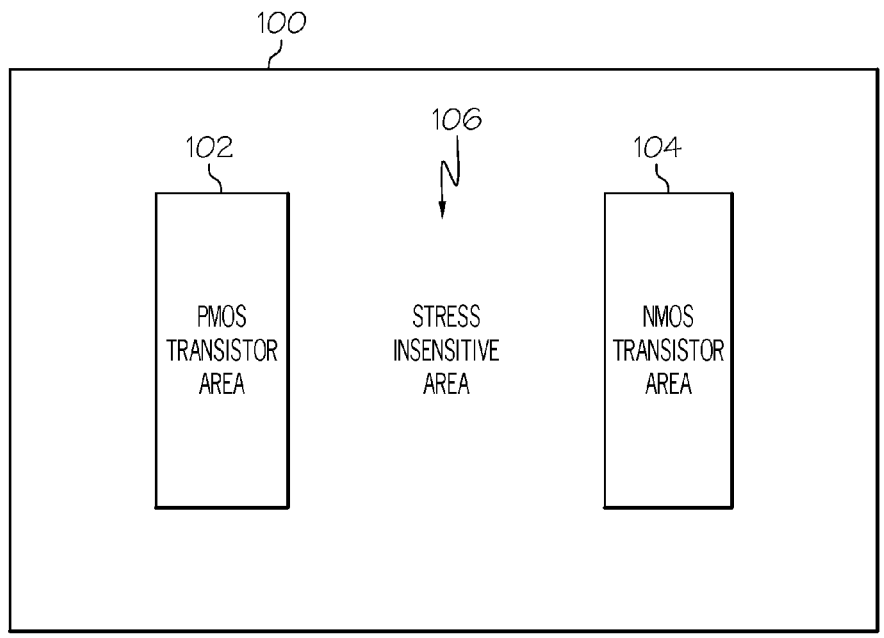
FIG. 1 is a schematic top view of a portion of a semiconductor wafer.

FIG. 1 is a schematic top view of a portion of a semiconductor wafer 100 having transistor device structures formed thereon. For this simplified diagram, wafer 100 includes a PMOS transistor area 102 corresponding to the location of one or more PMOS transistors, and an NMOS transistor area 104 corresponding to the location of one or more NMOS transistors. For ease of description, FIG. 1 depicts an overly simplified layout for wafer 100, where the layout includes both PMOS and NMOS transistors. An embodiment of wafer 100, however, need not include both transistor types. In other words, the techniques and technologies described herein are applicable to an embodiment having only PMOS transistors (and stress insensitive areas), and to an embodiment having only NMOS transistors (and stress insensitive areas).

In a typical CMOS implementation, p-wells and n-wells are formed in a lightly doped p-type substrate, where the wells are utilized for active transistor regions. For this example, a PMOS transistor area is the projected area (when viewed from the top or bottom of the wafer) occupied by the n-well of the PMOS transistor. This PMOS transistor area encompasses the active region of the PMOS transistor (where the source, drain, and channel region are formed). Likewise, an NMOS transistor area is the projected area (when viewed from the top or bottom of the wafer) occupied by the p-well of the NMOS transistor. This NMOS transistor area encompasses the active region of the NMOS transistor (where the source, drain, and channel region are formed).

Wafer 100 is also depicted with a stress insensitive area 106 corresponding to the location of stress insensitive features, i.e., features that are not affected by an overlying stress liner. A stress insensitive area generally defines the projected area (when viewed from the top or bottom of the wafer) occupied by stress insensitive devices, structures, elements, material, and/or components formed on the wafer, such as, without limitation: resistors, capacitors, fuses, conductive traces, inductors, diodes, or isolation regions. FIG. 1 depicts stress insensitive area 106 located between PMOS transistor area 102 and NMOS transistor area 104. In practice, however, stress insensitive area 106 need not be located as shown in FIG. 1. For example, stress insensitive area 106 may be located adjacent to PMOS transistor area 102 and/or adjacent to NMOS transistor area 104.

Stress liners can be used to enhance the performance of semiconductor based transistors. A compressive stress liner, which is formed from material that tends to shrink, can be formed over a PMOS transistor to improve the performance of the PMOS transistor. In contrast, a tensile stress liner, which is formed from material that tends to expand, can be formed over an NMOS transistor to improve the performance of the NMOS transistor. Indeed, some semiconductor manufacturing processes utilize a dual stress liner that includes both compressive and tensile stress liners for PMOS and NMOS transistors, respectively.

Stress liners are formed from an insulating material such as silicon nitride. Photolithographic techniques are utilized to produce stress liners having the desired coverage pattern over the wafer. The photoresist masks that define the boundaries of stress liners are typically generated using automated design tools. The conventional technique for automatically generating a photoresist mask for a stress liner defines the boundary of the mask layout according to the boundary of the n-well or the p-well of the corresponding transistor. For example, for n-well based automatic generation, the boundary of a compressive liner mask that is automatically generated in this manner will correspond to the boundary of the n-well of the PMOS transistor, and the cooperating tensile liner mask will result in coverage for the remaining areas that are outside the boundary of the n-well of the PMOS transistor. Similarly, for p-well based automatic generation, the boundary of a tensile liner mask that is automatically generated in this manner will correspond to the boundary of the p-well of the NMOS transistor, and the cooperating compressive liner mask will result in coverage for the remaining areas that are outside the boundary of the p-well of the NMOS transistor.

In certain applications it is desirable to extend the stress liner beyond the actual transistor area that is defined by the p-well (or the n-well) of the transistor. An extended compressive liner takes better advantage of the compressive characteristics of the compressive stress liner material, thus further enhancing performance of the PMOS transistor. Likewise, an extended tensile liner takes better advantage of the tensile characteristics of the tensile stress liner material, thus further enhancing performance of the NMOS transistor. Unfortunately, the conventional technique for automatically generating stress liner masks does not accommodate stress liner layouts that are not strictly defined by the p-well (or n-well) of the transistor. Consequently, the conventional technique cannot be used to generate optimized stress liner layouts that do not depend on such strict design rules.

The techniques and technologies described herein are utilized to automatically generate a stress liner photoresist mask in a manner that contemplates stress insensitive areas of the wafer and extends the mask to increase coverage of the stress liner material beyond the traditional boundary (which is defined by the p-well or n-well of the transistor). The automatically generated stress liner photoresist mask is then utilized during a semiconductor device fabrication process to create an enhanced stress liner for a transistor device.

Figure 2:
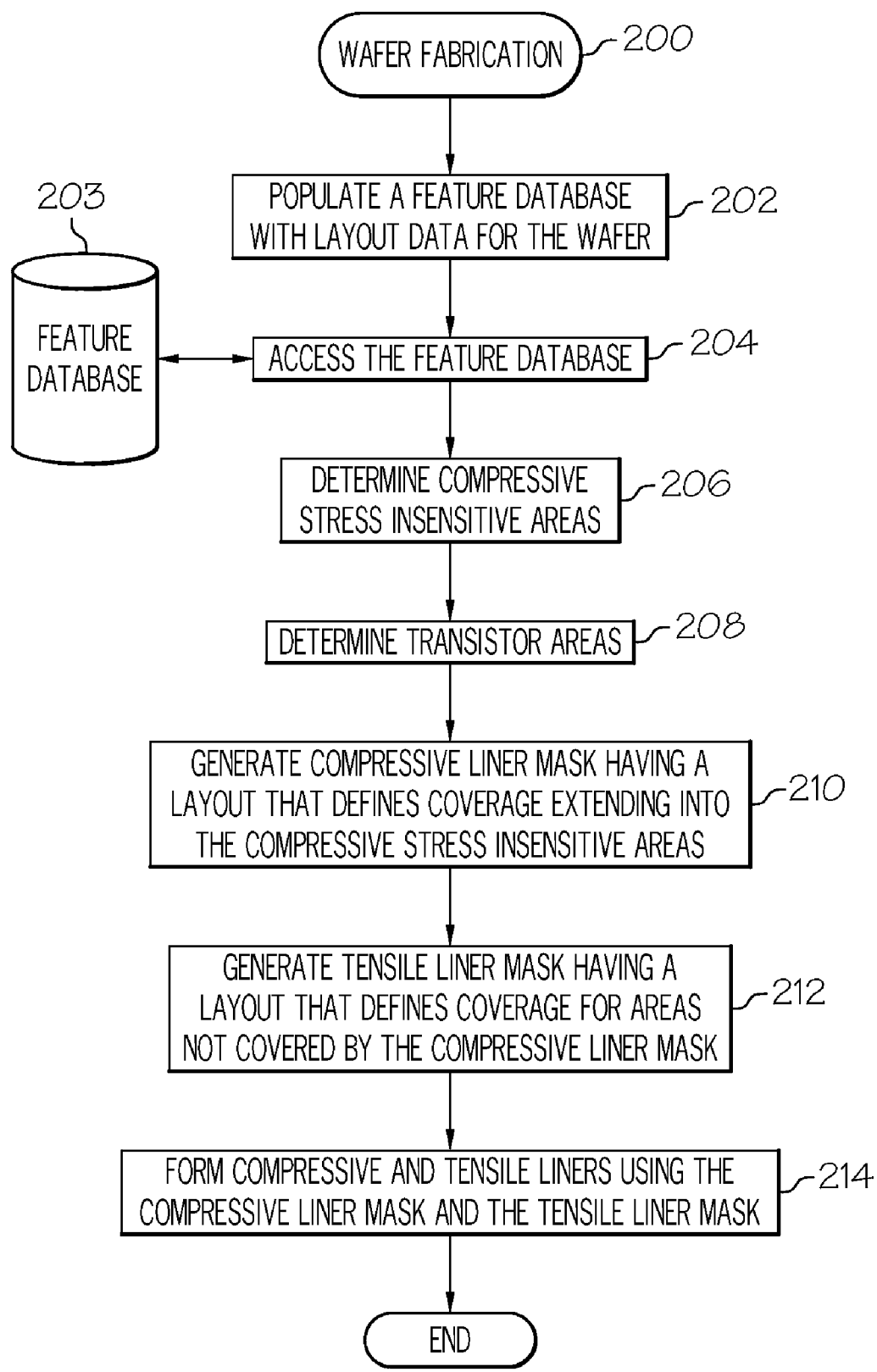
FIG. 2 is a flow chart that illustrates an embodiment of a wafer fabrication process.

FIG. 2 is a flow chart that illustrates an embodiment of a wafer fabrication process 200 that employs an extended stress liner. The various tasks performed in connection with process 200 may be performed by software, hardware, firmware, or any combination thereof. It should be appreciated that process 200 may include any number of additional or alternative tasks, the tasks shown in FIG. 2 need not be performed in the illustrated order, and process 200 may be incorporated into a more comprehensive procedure or process having additional functionality not described in detail herein.

One or more tasks/steps may be described in the general context of computer-executable instructions, such as program modules, executed by one or more computers or other devices. Generally, program modules include routines, programs, objects, components, data structures, and/or other elements that perform particular tasks or implement particular abstract data types. Typically, the functionality of the program modules may be combined or distributed as desired in various embodiments. A computing device that performs computer-executable instructions typically includes at least some form of computer readable media. Computer readable media can be any available media that can be accessed by a computing device and/or by applications executed by a computing device. By way of example, and not limitation, computer readable media may comprise computer storage media and communication media. Computer storage media includes volatile, nonvolatile, removable, and non-removable media implemented in any method or technology for storage of information such as computer readable instructions, data structures, program modules, or other data. Computer storage media includes, but is not limited to: RAM, ROM, EEPROM, flash memory or other memory technology; CD-ROM, digital versatile disks (DVD), or other optical storage; magnetic cassettes, magnetic tape, magnetic disk storage or other magnetic storage devices; or any other medium which can be used to store the desired information and which can accessed by a computing device. Communication media typically embodies computer readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Referring again to FIG. 2, process 200 populates a feature database with layout data for the wafer (task 202). FIG. 2 depicts a feature database 203, which may be implemented as one or more computer-readable storage elements accessed by a suitably configured computer device, system, or network. Feature database 203 contains layout data corresponding to the features of the particular semiconductor wafer, including, without limitation: active devices such as transistors; passive devices such as resistors, capacitors, or inductors; conductive traces; interconnects; metal layers; or diodes. More specifically, feature database 203 might contain layout data that indicates PMOS transistor areas for the wafer, NMOS transistor areas for the wafer, and/or stress insensitive areas for the wafer. In a practical embodiment, feature database 203 is populated using computer-aided semiconductor device design tools, and feature database 203 typically contains layout data corresponding to different material layers for the wafer. Such automated design tools are well known, and their operation and functionality will not be described in detail here.

In connection with the preparation of a stress liner photoresist mask, process 200 accesses feature database 203 (task 204). In particular, task 204 accesses the layout data contained in feature database 203. Process 200 proceeds to determine, from the layout data, stress insensitive areas for the wafer (task 206). Although process 200 and the subject matter described herein can be utilized for devices formed on a p-type semiconductor substrate or an n-type semiconductor substrate, this embodiment assumes that the semiconductor wafer includes a p-type semiconductor substrate. Moreover, this embodiment of process 200 assumes that the p-type semiconductor substrate includes n-wells formed therein (corresponding to PMOS transistor structures), and p-wells formed therein (corresponding to NMOS transistor structures). For this embodiment, task 206 determines stress insensitive areas for the wafer because compressive material will be used for a compressive stress liner on the PMOS transistor structures. In this embodiment, task 206 is automatically performed by a suitably written software application that identifies areas on the wafer that are relatively immune to the application of a compressive stress liner. In this regard, process 200 intelligently analyzes the layout data to identify the precise location of stress insensitive devices, components, elements, and features. In practice, the layout data can include general feature labels that describe the device/feature type corresponding to the respective area (e.g., "PMOS transistor," "NMOS transistor," "resistor," or "conductive trace"), and task 206 can determine whether a given area is stress insensitive from the feature label assigned to that area.

Figure 3:
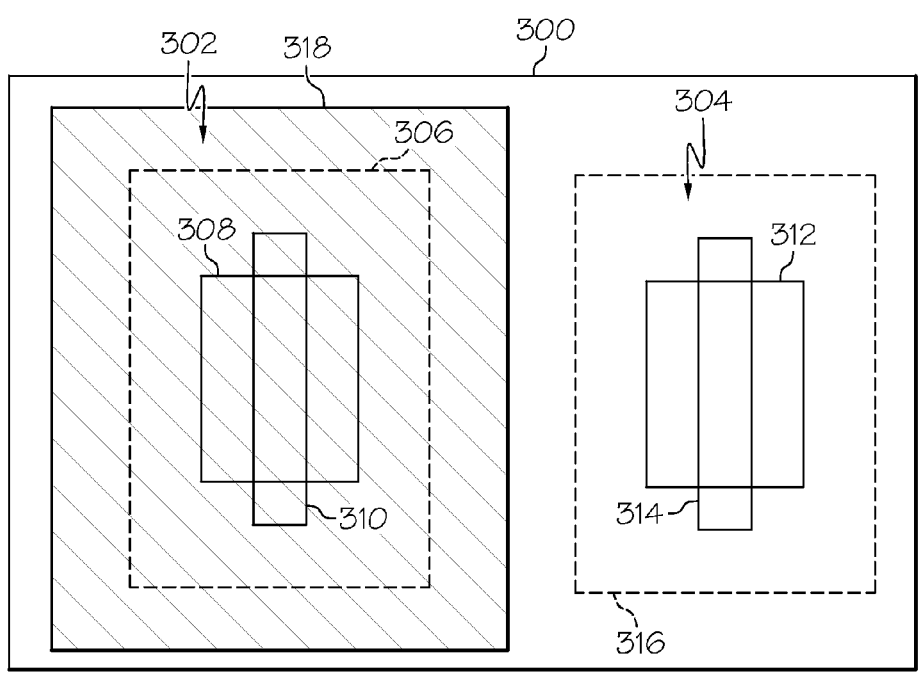
FIG. 3 is a schematic top view of a portion of a semiconductor wafer having transistor device structures formed thereon.

Process 200 also determines, from the layout data, transistor areas for the wafer (task 208). Task 208 may be performed concurrently with or in conjunction with task 206. For this example, the PMOS transistor areas correspond to the areas defined by the n-well boundaries of the PMOS transistors. Notably, at least the PMOS transistor areas will be covered by a compressive stress liner, which enhances the performance of the PMOS transistors. In this regard, FIG. 3 is a schematic and simplified top view of a portion of a semiconductor wafer 300 having transistor device structures formed thereon. For consistency with the embodiment being described in connection with process 200, FIG. 3 shows a PMOS transistor structure 302 and an NMOS transistor structure 304 formed on wafer 300. PMOS transistor structure 302 has a corresponding n-well 306 (depicted in dashed lines) in the semiconductor substrate, an active region 308 in n-well 306, and a gate structure 310 formed over active region 308. NMOS transistor structure 304 has a corresponding p-well 316 (depicted in dashed lines) in the semiconductor substrate, an active region 312 in p-well 316, and a gate structure 314 formed over active region 312. For this simplified example, the boundary of n-well 306 represents the PMOS transistor area, the boundary of p-well 316 represents the NMOS transistor area, the NMOS transistor area represents an area that is not stress insensitive (i.e., the NMOS transistor area is sensitive to compressive stress liner material), and the remaining area of wafer 300 is considered to be a stress insensitive area. Although not depicted in FIG. 3, the stress insensitive area can include any number of stress insensitive devices, features, components, structures, etc.

Referring back to FIG. 2, process 200 generates a compressive liner mask for the wafer (task 210). For this embodiment, the compressive liner mask is based upon the stress insensitive areas determined by task 206 and the PMOS transistor areas determined by task 208. In this regard, the compressive liner mask has a compressive liner layout that defines coverage for at least the PMOS transistor areas, coverage that extends into the stress insensitive areas, and exposure for any NMOS transistor areas. Process 200 can be controlled and configured such that the actual compressive liner layout is optimized to increase the beneficial effect of the compressive liner, while considering the locations of non-PMOS transistor features. FIG. 3 depicts a compressive liner layout 318 that is appropriate for this simplified example. Here, compressive liner layout 318 covers PMOS transistor structure 302, extends beyond the boundary of n-well 306, and extends into the stress insensitive area that is located between PMOS transistor structure 302 and NMOS transistor structure 304. Although not a requirement, compressive liner layout 318 ends short of p-well 316—this accommodates the use of an extended tensile liner for NMOS transistor structure 304, which may be desirable to increase the beneficial effect of the tensile liner. Those skilled in the art will recognize that a positive or a negative photoresist material (and corresponding photolithography technique) can be used to form the compressive liner mask.

Process 200 also generates a tensile liner mask for the wafer (task 212). For this embodiment, the tensile liner mask is based upon the compressive liner layout. In practice, the tensile liner layout can be defined as the negative of the compressive liner layout (a slight overlapping region may be included). Thus, the tensile liner mask has a tensile liner layout that defines coverage for areas on the wafer that are not covered by the compressive liner layout. For the example of FIG. 3, the tensile liner layout defines coverage for p-well 316 and the remaining area that is not defined by compressive liner layout 318. Those skilled in the art will recognize that a positive or a negative photoresist material (and corresponding photolithography technique) can be used to form the tensile liner mask.

Eventually, the wafer is subjected to various manufacturing process steps until the devices, structures, and/or features on the wafer are ready for the formation of stress liners. In this regard, process 200 forms the compressive and tensile liners using the appropriate compressive and tensile liner masks (task 214). Appropriate photolithographic techniques are utilized during task 214 to form the stress liners.

Although process 200 is described above in the context of a p-type semiconductor substrate wafer having n-wells for PMOS transistors and p-wells for NMOS transistors, an equivalent process can be carried out for an n-type semiconductor substrate wafer. For the sake of brevity, this equivalent process will not be described in detail here. Moreover, an alternate embodiment of process 200 first generates the tensile liner mask and thereafter generates the compressive liner mask as the negative of the tensile liner mask. In such an alternate embodiment, the tensile liner mask is generated such that it extends beyond the p-wells that define the NMOS transistor areas, and such that it extends into stress insensitive areas for the wafer. In other words, the tensile liner layout will define coverage for at least the NMOS transistor areas, coverage that extends into the stress insensitive areas, and exposure for any PMOS transistor areas. If utilized, the corresponding compressive liner mask will have a compressive liner layout that defines coverage areas that are not covered by the tensile liner layout.

FIGS. 4-8 are cross sectional views that illustrate an embodiment of a PMOS transistor structure 400 and a method of fabricating a dual stress liner on a semiconductor wafer 402. The fabrication process utilizes the automatically generated optimized stress liner masks described in more detail above. Although wafer 402 may eventually correspond to an entire integrated circuit (IC) device or multiple IC devices, for the sake of simplicity and brevity, FIGS. 4-8 do not depict any NMOS transistor structures or any stress insensitive structures formed on wafer 402. Upon completion of the fabrication process, wafer 402 can include one or more layers of material and/or features, such as lines, interconnects, vias, doped regions, active/passive devices, or the like, and devices on wafer 402 can include transistors, microactuators, microsensors, capacitors, resistors, diodes, or the like.

Figure 4:
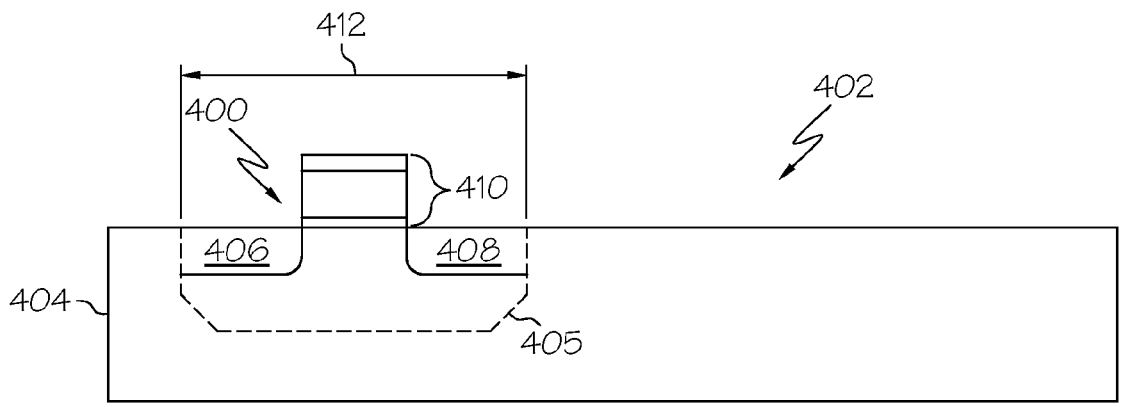
FIGS. 4-8 are cross sectional views that illustrate an embodiment of a PMOS transistor structure and a method of fabricating a dual stress liner.

FIG. 4 depicts an intermediate state in the fabrication process after formation of a suitably configured PMOS transistor structure 400. PMOS transistor structure 400 is formed using well known techniques and process steps (e.g., techniques and steps related to doping, photolithography and patterning, etching, material growth, material deposition, surface planarization, and the like), which will not be described in detail here. For this simplified depiction, PMOS transistor structure 400 includes, without limitation: a semiconductor substrate 404; an n-well 405 formed in semiconductor substrate 404; a source/drain region 406; a drain/source region 408; and a gate stack 410. The boundary of n-well 405 (identified by the arrow 412 in FIG. 4) corresponds to the PMOS transistor area for PMOS transistor structure 400. For this simplified embodiment, the remaining area of wafer 402 that is not occupied by PMOS transistor structure 400 represents stress insensitive area.

Semiconductor substrate 404 is preferably a monocrystalline silicon substrate, where the term "silicon substrate" is used herein to encompass the generally monocrystalline and relatively pure silicon materials typically used in the semiconductor industry. Semiconductor substrate 404 can be either n-type or p-type, but is typically p-type, as described here for this embodiment. Semiconductor substrate 404 may be a bulk silicon wafer or a thin layer of silicon on an insulating layer (commonly known as silicon-on-insulator or SOI) that, in turn, is supported by a silicon carrier wafer. For this embodiment, semiconductor substrate 404 is illustrated as a bulk silicon substrate.

Source/drain region 406 and drain/source region 408 are doped with n-type impurity dopants. These regions can be doped to the appropriate conductivity, for example, by ion implantation. Silicide contacts formed at the surface of source/drain region 406 and drain/source region 408 are not separately depicted in FIGS. 4-8. Shallow trench isolation (STI) may be employed for electrical isolation between the wells, and to isolate around individual devices that must be electrically isolated. As is well known, there are many processes that can be used to form the STI, and such processes need not be described here in detail. Gate stack 410 typically includes a gate insulator, polysilicon formed over the gate insulator, and a conductive gate contact formed over the polysilicon. The gate insulator is preferably an oxide material having a high dielectric constant (such as $HfO_2$, HfSiON, $LaAlO_3$, or $Al_2O_3$), and the gate contact is preferably a metal silicide.

Figure 5:
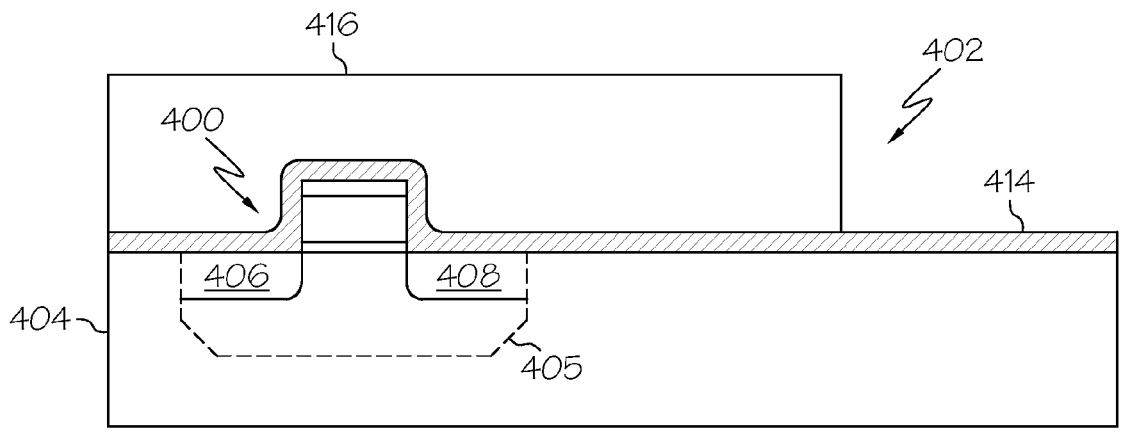

As mentioned above, wafer 402 and PMOS transistor structure 400 can be provided by performing various fabrication steps that result in that depicted in FIG. 4. Thereafter, wafer 402 and PMOS transistor structure 400 can be further processed in the manner described herein. For example, FIG. 5 depicts wafer 402 after: formation of a compressive material layer 414 on wafer 402, formation of a photoresist layer over compressive material layer 414, and patterning of the photoresist layer, resulting in a patterned photoresist layer 416.

Compressive material layer 414 is formed from a material that results in compressive stress, for example, compressive silicon nitride. In preferred embodiments, compressive material layer 414 is formed from compressive plasma enhanced nitride (CPEN) that is deposited over PMOS transistor structure 400 and the exposed surface of wafer 402 using plasma enhanced chemical vapor deposition (PECVD). Thus, compressive material layer 414 is formed over PMOS transistor structure 400 and over the stress insensitive area of wafer 402.

After formation of compressive material layer 414, a photoresist layer is formed over compressive material layer 414. The thickness and composition of the photoresist layer is selected in accordance with the desired process technology. The photoresist layer can comprise a variety of photoresist materials, compositions, or chemicals suitable for lithographic applications. The photoresist layer is formed over compressive material layer 414 using any suitable technique, for example, spin coating.

A compressive liner mask that has been automatically generated in the manner described above is utilized during the photolithography process to expose the photoresist layer in a selective manner to transfer the compressive liner layout to the photoresist layer. Thereafter, the exposed photoresist layer is developed to form patterned photoresist layer 416 (shown in FIG. 5). Notably, patterned photoresist layer 416 covers PMOS transistor structure 400 and a section of the stress insensitive area. FIG. 5 depicts this layout of patterned photoresist layer 416, which extends significantly beyond the left and right boundaries of n-well 405.

Figure 6:
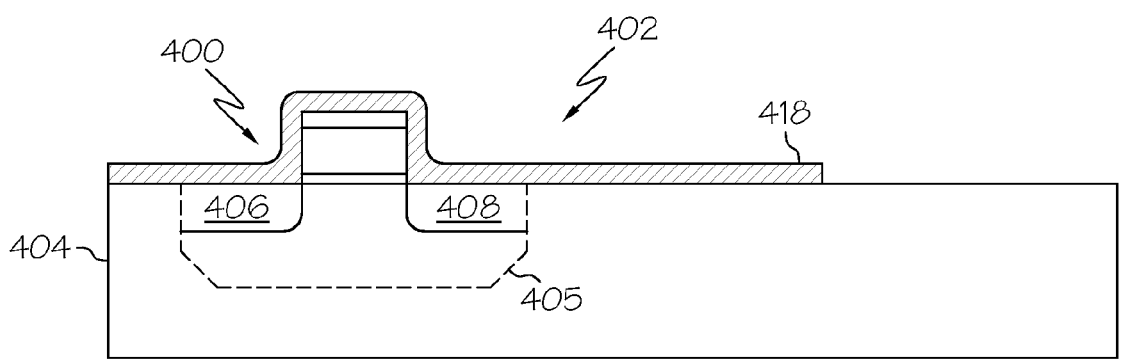

Although other IC circuit fabrication steps or sub-processes may be performed after formation of patterned photoresist layer 416, this example continues with an etching step, which may be associated with an isotropic etch technique, an anisotropic etch technique, or any suitable etch technique. In accordance with this embodiment, patterned photoresist layer 416 is utilized during an etching step where a portion of compressive material layer 414 is etched away. In particular, the portion of compressive material layer 414 that is unprotected by patterned photoresist layer 416 is etched, resulting in an etched compressive material layer 418 (see FIG. 6). FIG. 6 depicts wafer 402 after etching and removal of patterned photoresist layer 416. Notably, etched compressive material layer 418 covers PMOS transistor structure 400 and at least a portion of the stress insensitive area. The additional compressive stress imparted by the extended area of this compressive stress liner enhances the performance of PMOS transistor structure 400.

Figure 7:
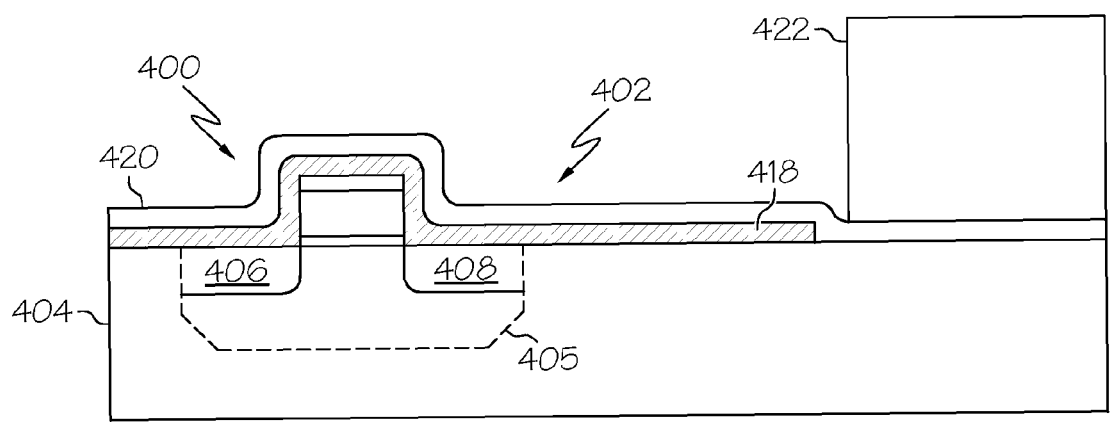

Additional fabrication steps or sub-processes may be performed after formation of etched compressive material layer 418. For example, FIG. 7 depicts wafer 402 after: formation of a tensile material layer 420 on wafer 402, formation of a photoresist layer over tensile material layer 420, and patterning of the photoresist layer, resulting in a patterned photoresist layer 422.

Tensile material layer 420 is formed from a material that results in tensile stress, for example, tensile silicon nitride. In preferred embodiments, tensile material layer 420 is formed from tensile plasma enhanced nitride (TPEN) that is deposited over etched compressive material layer 418 and the exposed surface of wafer 402 using PECVD. This exposed surface may represent a stress insensitive area and/or an NMOS transistor area for wafer 402.

After formation of tensile material layer 420, a respective photoresist layer is formed over tensile material layer 420. The thickness and composition of this photoresist layer is selected in accordance with the desired process technology. The photoresist layer can comprise a variety of photoresist materials, compositions, or chemicals suitable for lithographic applications. The photoresist layer is formed over tensile material layer 420 using any suitable technique, for example, spin coating.

A tensile liner mask that has been automatically generated in the manner described above is utilized during the photolithography process to expose the photoresist layer in a selective manner to transfer the tensile liner layout to the photoresist layer. Thereafter, the exposed photoresist layer is developed to form patterned photoresist layer 422 (shown in FIG. 7). Notably, patterned photoresist layer 422 leaves the material above PMOS transistor structure 400 and a section of the stress insensitive area exposed. FIG. 7 depicts this layout of patterned photoresist layer 422.

Figure 8:
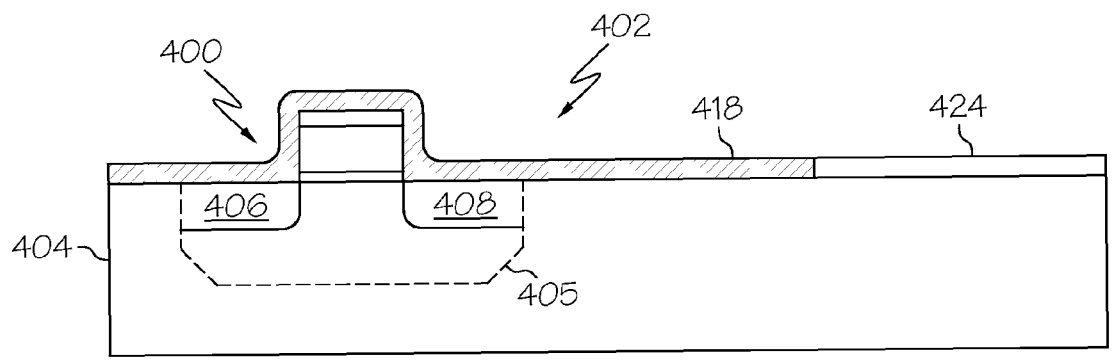

Although other IC circuit fabrication steps or sub-processes may be performed after formation of patterned photoresist layer 422, this example continues with an etching step, which may be associated with an isotropic etch technique, an anisotropic etch technique, or any suitable etch technique. In accordance with this embodiment, patterned photoresist layer 422 is utilized during an etching step where a portion of tensile material layer 420 is etched away. In particular, the portion of tensile material layer 420 that is unprotected by patterned photoresist layer 422 is etched, resulting in an etched tensile material layer 424 (see FIG. 8). The etching is controlled such that etched compressive material layer 418 remains intact. FIG. 8 depicts wafer 402 after etching and removal of patterned photoresist layer 422. Notably, etched tensile material layer 424 occupies the area of wafer 402 that is not occupied by etched compressive material layer 418. Etched tensile material layer 424 represents the tensile stress liner for wafer 402, and etched compressive material layer 418 represents the compressive stress liner for wafer 402. In practice, etched compressive material layer 418 and etched tensile material layer 424 may be intentionally formed to overlap based on the available stress insensitive area, such that both the NMOS and PMOS devices are enhanced.

Thereafter, any number of known process steps can be performed to complete the fabrication of wafer 402 and the devices, structures, and features formed thereon. It should be appreciated that a plurality of PMOS devices on a single wafer can be concurrently fabricated using the techniques and technologies described above. Furthermore, as mentioned above, a CMOS device implementation can be fabricated using the techniques and technologies described above.

FIGS. 4-8 and the accompanying description applies to an embodiment where the CPEN liner is formed before the TPEN liner. Alternatively, the configuration shown in FIG. 8 can be obtained by forming the TPEN liner before the CPEN liner. Moreover, an embodiment that utilizes an n-type semiconductor substrate with p-wells for NMOS transistors and n-wells for PMOS transistors can be manufactured in an equivalent manner using suitably configured stress liner masks that are automatically derived from the p-well boundaries using the technique described above.

While at least one embodiment has been presented in the foregoing detailed description, it should be appreciated that a vast number of variations exist. It should also be appreciated that the embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A fabrication method for semiconductor devices, the method comprising:
   accessing a feature database for a semiconductor wafer, the feature database containing layout data corresponding to features for the semiconductor wafer, the layout data indicating p-type metal oxide semiconductor (PMOS) transistor areas for the semiconductor wafer;
   determining, from the layout data, stress insensitive areas for the semiconductor wafer; and
   generating a compressive liner mask for the semiconductor wafer, the compressive liner mask having a compressive liner layout that defines coverage for at least the PMOS transistor areas and coverage that extends into the stress insensitive areas.

2. The method of claim 1, wherein:
   the layout data also indicates n-type metal oxide semiconductor (NMOS) transistor areas for the semiconductor wafer; and
   generating a compressive liner mask comprises generating the compressive liner mask such that the compressive liner layout defines coverage for at least the PMOS transistor areas, coverage that extends into the stress insensitive areas, and exposure for the NMOS transistor areas.

3. The method of claim 1, further comprising:
   providing a wafer having formed thereon a PMOS transistor structure and a stress insensitive area;
   forming a compressive material layer on the semiconductor wafer, including over the PMOS transistor structure and over the stress insensitive area;
   forming a photoresist layer over the compressive material layer; and
   patterning the photoresist layer using the compressive liner mask during a photolithography process, resulting in a patterned photoresist layer that covers the PMOS transistor structure and a section of the stress insensitive area.

4. The method of claim 3, further comprising etching a portion of the compressive material layer that is unprotected by the patterned photoresist layer, resulting in an etched compressive material layer, wherein the etched compressive material layer covers the PMOS transistor structure and the section of the stress insensitive area.

5. The method of claim 1, further comprising generating, based upon the compressive liner layout, a tensile liner mask for the semiconductor wafer, the tensile liner mask having a tensile liner layout that defines coverage for areas on the semiconductor wafer that are not covered by the compressive liner layout.

6. The method of claim 5, further comprising:
   providing a wafer having formed thereon a PMOS transistor structure and a stress insensitive area;
   forming a tensile material layer on the semiconductor wafer, including over the PMOS transistor structure and over the stress insensitive area;
   forming a photoresist layer over the tensile material layer; and
   patterning the photoresist layer using the tensile liner mask during a photolithography process, resulting in a patterned photoresist layer that leaves the PMOS transistor structure and a section of the stress insensitive area exposed.

7. The method of claim 6, further comprising etching a portion of the tensile material layer that is unprotected by the patterned photoresist layer, resulting in an etched tensile material layer, wherein the etched tensile material layer leaves the PMOS transistor structure and the section of the stress insensitive area exposed.

8. A fabrication method for semiconductor devices, the method comprising:
   accessing a feature database for a semiconductor wafer, the feature database containing layout data corresponding to features for the semiconductor wafer, the layout data indicating n-type metal oxide semiconductor (NMOS) transistor areas for the semiconductor wafer;
   determining, from the layout data, stress insensitive areas for the semiconductor wafer; and
   generating a tensile liner mask for the semiconductor wafer, the tensile liner mask having a tensile liner layout that defines coverage for at least the NMOS transistor areas and coverage that extends into the stress insensitive areas.

9. The method of claim 8, wherein:
   the layout data also indicates p-type metal oxide semiconductor (PMOS) transistor areas for the semiconductor wafer; and
   generating a tensile liner mask comprises generating the tensile liner mask such that the tensile liner layout defines coverage for at least the NMOS transistor areas, coverage that extends into the stress insensitive areas, and exposure for the PMOS transistor areas.

10. The method of claim 8, further comprising:
    providing a wafer having formed thereon an NMOS transistor structure and a stress insensitive area;
    forming a tensile material layer on the semiconductor wafer, including over the NMOS transistor structure and over the stress insensitive area;
    forming a photoresist layer over the tensile material layer; and
    patterning the photoresist layer using the tensile liner mask during a photolithography process, resulting in a patterned photoresist layer that covers the NMOS transistor structure and a section of the stress insensitive area.

11. The method of claim 10, further comprising etching a portion of the tensile material layer that is unprotected by the patterned photoresist layer, resulting in an etched tensile material layer, wherein the etched tensile material layer covers the NMOS transistor structure and the section of the stress insensitive area.

12. The method of claim 8, further comprising generating, based upon the tensile liner layout, a compressive liner mask for the semiconductor wafer, the compressive liner mask having a compressive liner layout that defines coverage for areas on the semiconductor wafer that are not covered by the tensile liner layout.

13. The method of claim 12, further comprising:
providing a wafer having formed thereon an NMOS transistor structure and a stress insensitive area;
forming a compressive material layer on the semiconductor wafer, including over the NMOS transistor structure and over the stress insensitive area;
forming a photoresist layer over the compressive material layer; and
patterning the photoresist layer using the compressive liner mask during a photolithography process, resulting in a patterned photoresist layer that leaves the NMOS transistor structure and a section of the stress insensitive area exposed.

14. The method of claim 13, further comprising etching a portion of the compressive material layer that is unprotected by the patterned photoresist layer, resulting in an etched compressive material layer, wherein the etched compressive material layer leaves the NMOS transistor structure and the section of the stress insensitive area exposed.

15. A fabrication method for semiconductor devices, the method comprising
forming a p-type metal oxide semiconductor (PMOS) transistor structure on a semiconductor substrate;
forming stress insensitive features on the semiconductor substrate, the stress insensitive features being located adjacent to the PMOS transistor structure; and
forming a compressive stress liner over the PMOS transistor structure and over at least some of the stress insensitive features, the compressive stress liner being patterned with a compressive liner mask that is automatically generated based upon layout locations of the PMOS transistor structure and the stress insensitive features.

16. The method of claim 15, further comprising forming a tensile stress liner over a portion of the stress insensitive features.

17. The method of claim 16, wherein forming a tensile stress liner comprises forming the tensile stress liner over the stress insensitive features that are not covered by the compressive stress liner.

18. The method of claim 15, wherein forming a compressive stress liner comprises:
forming a compressive material layer over the PMOS transistor structure and the stress insensitive features;
forming a photoresist layer over the compressive material layer; and
patterning the photoresist layer using the compressive liner mask during a photolithography process, resulting in a patterned photoresist layer that covers the PMOS transistor structure and the at least some of the stress insensitive features.

19. The method of claim 15, further comprising defining a boundary of the compressive liner mask based upon the layout locations of the PMOS transistor structure and the stress insensitive features.

20. A fabrication method for semiconductor devices, the method comprising
forming an n-type metal oxide semiconductor (NMOS) transistor structure on the semiconductor substrate;
forming stress insensitive features on the semiconductor substrate, the stress insensitive features being located adjacent to the NMOS transistor structure; and
forming a tensile stress liner over the NMOS transistor structure and over at least some of the stress insensitive features, the tensile stress liner being patterned with a tensile liner mask that is automatically generated based upon layout locations of the NMOS transistor structure and the stress insensitive features.

21. The method of claim 20, further comprising forming a compressive stress liner over a portion of the stress insensitive features.

22. The method of claim 21, wherein forming a compressive stress liner comprises forming the compressive stress liner over the stress insensitive features that are not covered by the tensile stress liner.

23. The method of claim 20, wherein forming a tensile stress liner comprises:
forming a tensile material layer over the NMOS transistor structure and the stress insensitive features;
forming a photoresist layer over the tensile material layer; and
patterning the photoresist layer using the tensile liner mask during a photolithography process, resulting in a patterned photoresist layer that covers the NMOS transistor structure and the at least some of the stress insensitive features.

24. The method of claim 20, further comprising defining a boundary of the tensile liner mask based upon the layout locations of the NMOS transistor structure and the stress insensitive features.

* * * * *